US010332000B2

(12) United States Patent
Park et al.

(10) Patent No.: US 10,332,000 B2
(45) Date of Patent: Jun. 25, 2019

(54) SYNAPSE AND NEUROMORPHIC DEVICE INCLUDING THE SAME

(71) Applicant: SK hynix Inc., Icheon (KR)

(72) Inventors: Sang-Su Park, Icheon (KR); Hyung-Dong Lee, Icheon (KR)

(73) Assignee: SK hynix Inc., Icheon (KR)

( * ) Notice: Subject to any disclaimer, the term of this patent is extended or adjusted under 35 U.S.C. 154(b) by 601 days.

(21) Appl. No.: 15/094,033

(22) Filed: Apr. 8, 2016

(65) Prior Publication Data

US 2017/0109624 A1 Apr. 20, 2017

(30) Foreign Application Priority Data

Oct. 20, 2015 (KR) ........................ 10-2015-0145912

(51) Int. Cl.
*G06N 3/063* (2006.01)
*H01L 45/00* (2006.01)
*G06N 3/08* (2006.01)

(52) U.S. Cl.
CPC ............. *G06N 3/0635* (2013.01); *G06N 3/08* (2013.01); *H01L 45/085* (2013.01)

(58) Field of Classification Search
CPC ............................ G06N 3/063; G06N 3/0635
See application file for complete search history.

(56) References Cited

U.S. PATENT DOCUMENTS

| | | | |
|---|---|---|---|
| 7,446,066 B1 | 11/2008 | Sun | |
| 8,847,196 B2 | 9/2014 | Rocklein et al. | |
| 9,246,091 B1* | 1/2016 | Wang | H01L 45/1253 |
| 2011/0004579 A1* | 1/2011 | Snider | G06N 3/049 |
| | | | 706/25 |
| 2012/0267596 A1* | 10/2012 | Tseng | H01L 45/08 |
| | | | 257/4 |
| 2012/0292584 A1* | 11/2012 | Rocklein | H01L 45/08 |
| | | | 257/2 |
| 2016/0351259 A1* | 12/2016 | Jeon | G06F 11/1048 |
| 2017/0017879 A1* | 1/2017 | Kataeva | G06N 3/084 |

(Continued)

FOREIGN PATENT DOCUMENTS

KR 10-1326077 B1 11/2013

OTHER PUBLICATIONS

Jackson et al. (Oscillatory Neural Networks Based on TMO Nano-Oscillators and Multi-Level RRAM Cells, IEEE Journal on Emerging and Selected Topics in Circuits and Systems, vol. 5, No. 2, Jun. 2015, pp. 230-241) (Year: 2015).*

(Continued)

*Primary Examiner* — Hal Schnee

(57) ABSTRACT

A synapse and a neuromorphic device including the same are provided. The synapse includes: a first electrode; a second electrode spaced apart from the first electrode; an oxygen-containing layer disposed between the first electrode and the second electrode; a reactive metal layer disposed between the oxygen-containing layer and the second electrode and capable of reacting with oxygen ions from the oxygen-containing layer; and an oxygen diffusion-retarding layer provided between the oxygen-containing layer and the reactive metal layer, the oxygen diffusion-retarding layer hindering movement of oxygen ions from the oxygen-containing layer to the reactive metal layer.

12 Claims, 6 Drawing Sheets

(56) References Cited

U.S. PATENT DOCUMENTS

2017/0271591 A1* 9/2017 Jackson .................. H01L 45/08

OTHER PUBLICATIONS

Yu et al. (An Electronic Synapse Device Based on Metal Oxide Resistive Switching Memory for Neuromorphic Computation, IEEE Transactions on Electron Devices, vol. 58, No. 8, Aug. 2011, pp. 2729-2737) (Year: 2011).*

Zhao et al. (Multi-level control of conductive nano-filament evolution in HfO2 ReRAM by pulse-train operations, Nanoscale, 2014, 6, 5698-5702) (Year: 2014).*

Liu, et. al, Optimization of Non-Linear Conductancemodulation Based on Metal Oxide Memristors, De Gruyter, University of Electronic Science and Technology of China, Nanotechnol Rev. 2018; 7(5): 443-468.

* cited by examiner

SYNAPSE AND NEUROMORPHIC DEVICE INCLUDING THE SAME

CROSS-REFERENCE TO RELATED APPLICATIONS

The present application claims priority of Korean Patent Application No. 10-2015-0145912, entitled "SYNAPSE AND NEUROMORPHIC DEVICE INCLUDING THE SAME" and filed on Oct. 20, 2015, which is incorporated herein by reference in its entirety.

BACKGROUND

1. Field

Exemplary embodiments of the present disclosure relate to neuromorphic devices that mimic a human nervous system, and their applications.

2. Description of the Related Art

Recently, as electronic appliances trend toward miniaturization, low power consumption, high performance, multi-functionality, and so on, technology capable of efficiently processing large-volume information has been demanded. In particular, neuromorphic technology for mimicking neurobiological architectures present in a human nervous system has received much attention to implement the technology of efficiently processing large-volume information. The human nervous system includes several thousand billions of neurons and synapses serving as junctions between the respective neurons. In the neuromorphic technology, neuron circuits and synapse circuits, which correspond to neurons and synapses, respectively, are designed to realize neuromorphic devices. The neuromorphic devices may be used in various applications including data classification, pattern recognition, and the like.

SUMMARY

Embodiments of the present disclosure are directed to a synapse having enhanced symmetry and linearity, and to a neuromorphic device including the same.

In accordance with an embodiment, a synapse includes: a first electrode; a second electrode spaced apart from the first electrode; an oxygen-containing layer disposed between the first electrode and the second electrode; a reactive metal layer disposed between the oxygen-containing layer and the second electrode and capable of reacting with oxygen ions from the oxygen-containing layer; and an oxygen diffusion-retarding layer provided between the oxygen-containing layer and the reactive metal layer, the oxygen diffusion-retarding layer hindering movement of oxygen ions from the oxygen-containing layer to the reactive metal layer.

In the embodiment, electrical conductivity of the synapse changes depending on a thickness of a dielectric layer generated by a reaction between the oxygen-containing layer and the reactive metal layer. The thickness of the dielectric layer generated by a reaction between the oxygen-containing layer and the reactive metal layer increases with an increase in a number of electrical pulses having a first polarity, which are applied through the first and second electrodes, and the thickness of the dielectric layer decreases with an increase in a number of electrical pulses having a second polarity opposite to the first polarity, which are applied through the first and second electrodes. The first-polarity electrical pulses and the second-polarity electrical pulses have a constant width or constant magnitude, or both. The oxygen diffusion-retarding layer has a thickness that does not completely blocks the movement of the oxygen ions. The oxygen diffusion-retarding layer includes a dielectric material or a semiconductor material. The synapse further includes a resistance layer located between the first electrode and the oxygen-containing layer and/or between the second electrode and the reactive metal layer, the resistance layer increasing a resistance value of the synapse. A potentiation operation is performed so that electrical conductivity of the synapse progressively increases with an increase in the number of electrical pulses having a second polarity, which are applied through the first and second electrodes, and a depression operation is performed so that the electrical conductivity of the synapse progressively decreases with an increase in the number of electrical pulses having a first polarity opposite to the second polarity, which are applied through the first and second electrodes. The electrical conductivity of the synapse in the potentiation operation is substantially symmetric with the electrical conductivity of the synapse in the depression operation. The rate of change in the electrical conductivity of the synapse in each of the potentiation operation and the depression operation is substantially constant. The first-polarity electrical pulses and the second-polarity electrical pulses have a constant width or a constant magnitude, or both. The electrical conductivity of the synapse does not change if at least one of the width and magnitude of each of the first-polarity electrical pulses and the second-polarity electrical pulses is less than a certain critical value.

In accordance with another embodiment, a neuromorphic device includes: a first neuron; a second neuron; a first line connected to the first neuron and extending in a first direction; a second line connected to the second neuron and extending in a second direction intersecting with the first line; and a synapse disposed between the first line and the second line and located at an intersection between the first line and the second line, wherein the synapse include: an oxygen-containing layer; a reactive metal layer disposed between the oxygen-containing layer and the second line and capable of reacting with oxygen ions from the oxygen-containing layer; and an oxygen diffusion-retarding layer provided between the oxygen-containing layer and the reactive metal layer, the oxygen diffusion-retarding layer hindering movement of oxygen ions from the oxygen-containing layer to the reactive metal layer. The first neuron is configured to derive the first line by selectively providing electrical pulses having a first polarity and electrical pulses having a second polarity opposite to the first polarity; a thickness of a dielectric layer generated by a reaction between the oxygen-containing layer and the reactive metal layer increases with an increase in the number of the electrical pulses having the first polarity, the electrical conductivity of the synapse decreasing as the thickness of the dielectric layer increases; and the thickness of the dielectric layer decreases with an increase in the number of the electrical pulses having the second polarity, the electrical conductivity of the synapse increasing as the thickness of the dielectric layer decreases. The synapse further includes a resistance layer located between the first line and the oxygen-containing layer and/or between the second line and the reactive metal layer, the resistance layer increasing a resistance value of the synapse.

In accordance with still another embodiment, a synapse includes: first and second electrodes configured to receive electrical pulses; and a variable resistance material interposed between the first electrode and the second electrode, wherein the variable resistance material layer includes a plurality of layers through which a potentiation operation and a depression operation are performed, wherein the potentiation operation is performed so that the electrical conductivity of the synapse progressively increases with an increase in the number of electrical pulses having a second polarity, which are applied through the first and second electrodes, and wherein the depression operation is performed so that the electrical conductivity of the synapse progressively decreases with an increase in the number of electrical pulses having a first polarity opposite to the second polarity, which are applied through the first and second electrodes. The electrical conductivity of the synapse in the potentiation operation is substantially symmetric with the electrical conductivity of the synapse in the depression operation. The rate of change in the electrical conductivity of the synapse in each of the potentiation operation and the depression operation is substantially constant. The first-polarity electrical pulses and the second-polarity electrical pulses have a constant width or constant magnitude, or both. The electrical conductivity of the synapse does not change if at least one of the width and magnitude of each of the first-polarity electrical pulses and the second-polarity electrical pulses is less than a certain critical value.

DETAILED DESCRIPTION

Figure 1:
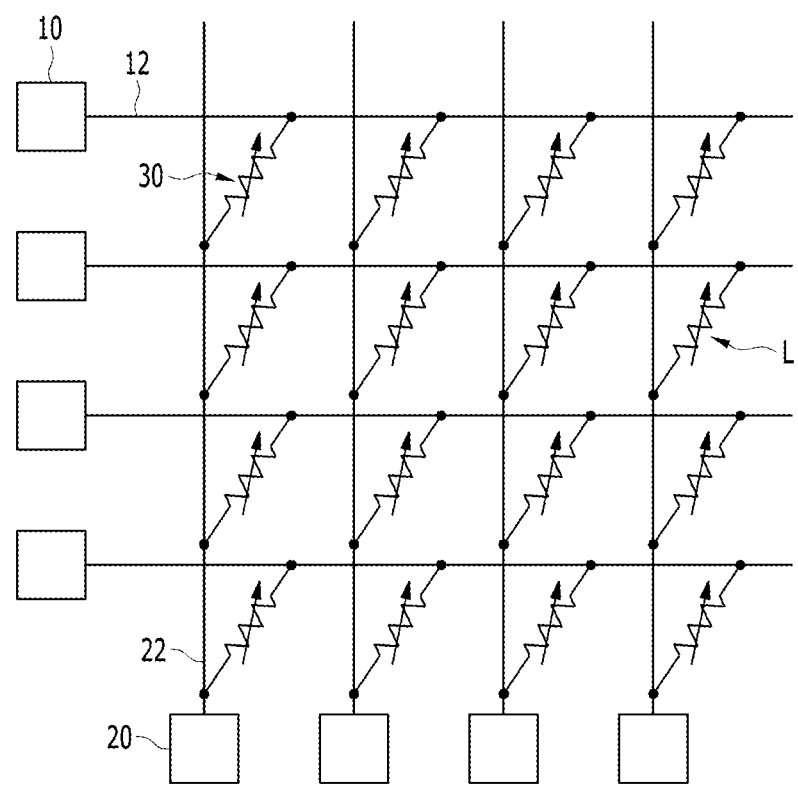
FIG. 1 illustrates a neuromorphic device according to an embodiment.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 illustrates a neuromorphic device according to an embodiment.

Referring to FIG. 1, the neuromorphic device may include a plurality of presynaptic neurons 10, a plurality of postsynaptic neurons 20, and synapses 30 that provide connections between the plurality of presynaptic neurons 10 and the plurality of postsynaptic neurons 20.

For illustrative convenience, the neuromorphic device shown in FIG. 1 includes four presynaptic neurons 10, four postsynaptic neurons 20, and sixteen synapses 30, but the numbers of presynaptic neurons, postsynaptic neurons, and synapses may be changed in various ways. If the number of presynaptic neurons 10 is N and the number of postsynaptic neurons 20 is M, N*M synapses 30 may be arranged in a matrix form, wherein N and M are natural numbers equal to or greater than 2, and may or may not be equal to each other.

For this arrangement, the neuromorphic device may further include a plurality of first lines 12 and a plurality of second lines 22. The plurality of first lines 12 may be coupled to the plurality of presynaptic neurons 10, respectively, and extend in a first direction, for example, a horizontal direction with respect to the orientation of FIG. 1. The plurality of second lines 22 may be coupled to the plurality of postsynaptic neurons 20, respectively, and extend in a second direction intersecting with the first direction, for example, a vertical direction with respect to the orientation of FIG. 1. Hereinafter, for convenience of explanation, the first line 12 extending in the first direction will be referred to as a "row line," and the second line 22 extending in the second direction will be referred to as a "column line". The plurality of synapses 30 may be disposed at intersections between the row lines 12 and the column lines 22, and couple the corresponding row lines 12 to the corresponding column lines 22.

The presynaptic neurons 10 may generate a signal (e.g., a signal corresponding to certain data) and transmit the generated signal to the row lines 12. The postsynaptic lines 20 may receive, through the column lines 22, a synaptic signal corresponding to the signal of the row lines 12 that has passed through the synapses 30, and process the received synaptic signal.

The row lines 12 may correspond to axons of the presynaptic neurons 10, and the column lines 22 may correspond to dendrites of the postsynaptic neurons 20. However, whether a neuron of interest is a presynaptic neuron or a postsynaptic neuron may be determined by the relationship between the neuron and another neuron. For example, when the presynaptic neuron 10 receives a synaptic signal from another neuron, it may function as a postsynaptic neuron. Similarly, when the postsynaptic neuron 20 transmits a signal to another neuron, it may function as a presynaptic neuron. The presynaptic neurons 10 and the postsynaptic neurons 20 may be implemented using various circuits such as CMOSs.

The presynaptic neurons 10 and the postsynaptic neurons 20 are connected by the synapses 30. Herein, the synapse 30 is an element that has electrical conductance or weight changing according to an electrical pulse (e.g., voltage or current) applied thereto.

Each of the synapses 30 may include a variable resistance element. The variable resistance element is an element capable of switching between different resistance states according to a voltage or current applied thereto. The variable resistance element may have a single-layer structure or multi-layer structure which includes various materials having a plurality of resistance states. The variable materials may include metal oxides such as transition metal oxides or perovskite-based materials, phase-change materials such as chalcogenide-based materials, ferroelectric materials, ferromagnetic materials, and the like. In other implementations, each synapse 30 may include a memory element that has the ability to achieve a number of distinct intermediary states, e.g., phase-change memory (PCM). PCM or the like may be used in place of or in addition to a variable resistance element.

An operation in which the variable resistance element of the synapse 30 switches from a high-resistance state to a low-resistance state may be referred to as a set operation. An operation in which the variable resistance element of the synapse 30 switches from the low-resistance state to the high-resistance state may be referred to as a reset operation.

Unlike variable resistance elements that are used in memory devices such as RRAM, PRAM, FRAM or MRAM devices, the synapse 30 in the neuromorphic device undergoes no abrupt resistance change in the set operation and the reset operation, and shows an analog behavior in which electrical conductivity thereof gradually changes according to the number and/or magnitude of electrical pulses applied thereto. Thus, the synapse 30 may have various characteristics distinguishable from those of a variable resistance element of a memory device. This is because characteristics required for the synapse 30 in the neuromorphic device differ from characteristics required for a variable resistance element of a memory device. For a memory device, it is preferred that a variable resistance element used in the memory device should maintain its electrical conductivity before a set operation or a reset operation is performed, even if electrical pulses are repeatedly applied thereto. The reason is to store different data by clearly distinguishing between a low-resistance state and a high-resistance state. The characteristics of the synapses 30 suitable for the neuromorphic device will be described later with reference to FIGS. 2A to 2D.

A learning operation of the neuromorphic device of FIG. 1 will be described by way of example. For convenience of explanation, the four row lines 12 may be sequentially referred to as a first row line, a second row line, a third row line, and a fourth row line from top to bottom with respect to the orientation of FIG. 1, and the four column lines 22 may be sequentially referred to as a first column line, a second column line, a third column line, and a fourth column line from left to right with respect to the orientation of FIG. 1.

In an initial stage, the synapses 30 may be in a high-resistance state. If at least one of the synapses 30 is in a low-resistance state in the initial stage, an initialization operation for changing the low-resistance state of the synapses 30 to a high-resistance state needs to be performed. Each of the synapses 30 may have a certain critical value. More specifically, if a voltage or current lower than the certain critical value is applied to the synapse 30, the electrical conductivity of the synapse 30 may not change, and if a voltage or current higher than the certain critical value is applied to the synapse 30, the electrical conductivity of the synapse 30 may change.

In this state, in order to perform an operation for learning certain data in any column line 22, an input signal corresponding to the certain data may be input to the row lines 12 so that an electrical pulse is selectively applied to each of the row lines 12 according to the certain data. For example, if an input signal corresponding to data '0011' is input to the row lines 12, an electrical pulse may not be applied to row lines 12 corresponding to '0,' for example, the first and second row lines, and electrical pulses may be applied to row lines 12 corresponding to '1,' for example, the third and fourth row lines.

At this time, the column lines 22 may be selectively driven at a suitable voltage or current for the learning operation.

As an example, if column lines 22 to learn the certain data are predetermined, the predetermined column lines 22 may be driven such that synapses 30 located at intersections between the row lines 12 corresponding to '1' and the predetermined column lines 22 may receive a voltage equal to or higher than a voltage required for a set operation (hereinafter, referred to as a set voltage), and the remaining columns 22 except the predetermined column lines 22 may be driven such that the remaining synapses 30 may receive a voltage lower than the set voltage. Referring to FIG. 1, the remaining synapses are synapses other than the synapses 30 located at the intersections between the row lines 12 corresponding to '1' and the predetermined column lines 22.

For example, if the magnitude of the set voltage is Vset and the third column line is predetermined as a column line to learn the data '0011,' the magnitude of the electrical pulse that is applied to each of the third and fourth row lines may be equal to or higher than Vset such that two synapses 30 located at intersections between the third column line and the third and fourth row lines receive a voltage equal to or higher than Vset. At this time, a voltage that is applied to the third column line may be 0 V. Thus, the two synapses 30 may be changed to a low-resistance state. Electrical conductivity of the synapses 30 in the low-resistance state may gradually increase as the number of electrical pulses applied thereto increases. On the other hand, a voltage that is applied to the remaining column lines (i.e., the first, second and fourth column lines) may have the magnitude between 0 V and Vset, for example, ½ Vset, such that the remaining synapses 30 receive a voltage lower than Vset. Thus, resistance states of the remaining synapses 30 may not change.

If the row lines 12 and the column lines 22 are driven in the above-described manner, the synapses that receive electrical pulses, for example, the two synapses 30 located at intersections between the third and fourth row lines and the third column line, may have the electrical conductivity gradually increasing while a current flowing through the two synapses 30 to the third column line increases. When the current flowing to the third column line is measured and thus the measured current reaches a certain critical current, the third column line can be a 'column line that has leaned specific data,' for example, a column line that has learned the data '0011.'

As another example, a column line to learn specific data may not be predetermined. In this case, a current flowing to each of the column lines 22 is measured while electrical pulses corresponding to the specific data are applied to the row lines 12. Based on the measurement results, if it is determined that the first column line has reached the certain critical current before the other column lines, e.g., the second to fourth column lines, the first column line can be determined to be a column line that has learned the specific data.

In the above-described manner, the other column lines can learn different data from the specific data in other learning operations.

Meanwhile, although the learning operation described above describes only for the set operation of changing the resistance state of the synapses 30 from a high-resistance state to a low-resistance state and the operation of increasing the electrical conductivity of the synapses 30, the reset operation of changing the resistance state of the synapses 30 from the low-resistance state to the high-resistance state and an operation of reducing the electrical conductivity of the synapses 30 may also be required for the learning operation.

For example, the polarity of pulses that are applied in the set operation of the synapses 30 and the operation of increasing the electrical conductivity of the synapses 30 may be opposite to the polarity of pulses that are applied in the reset operation of the synapses 30 and the operation of reducing the electrical conductivity of the synapses 30. The operation of increasing the electrical conductivity of the synapses 30 may be referred to as a 'potentiation operation,' and the operation of reducing the electrical conductivity of the synapses 30 may be referred to as a 'depression operation.'

Hereinafter, characteristics of a synapse suitable for a neuromorphic device will be described in detail with reference to FIGS. 2A to 2D.

FIGS. 2A to 2D illustrate characteristics associated with each of the synapses 30 shown in FIG. 1.

Figure 2A:
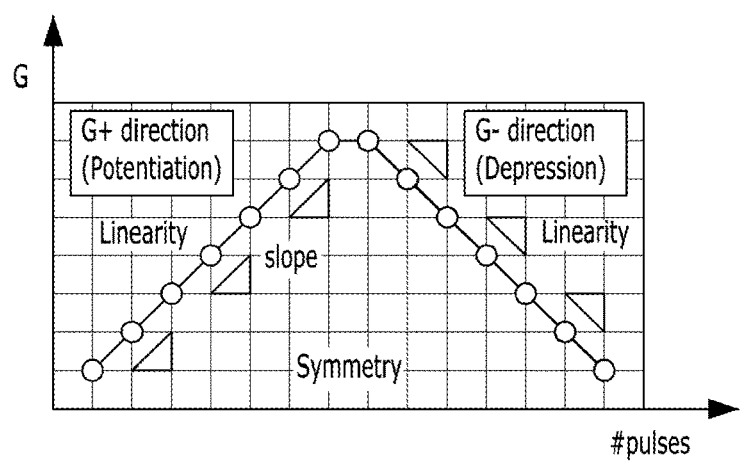
FIGS. 2A to 2D illustrate characteristics associated with synapses shown in FIG. 1.
Figure 2B:
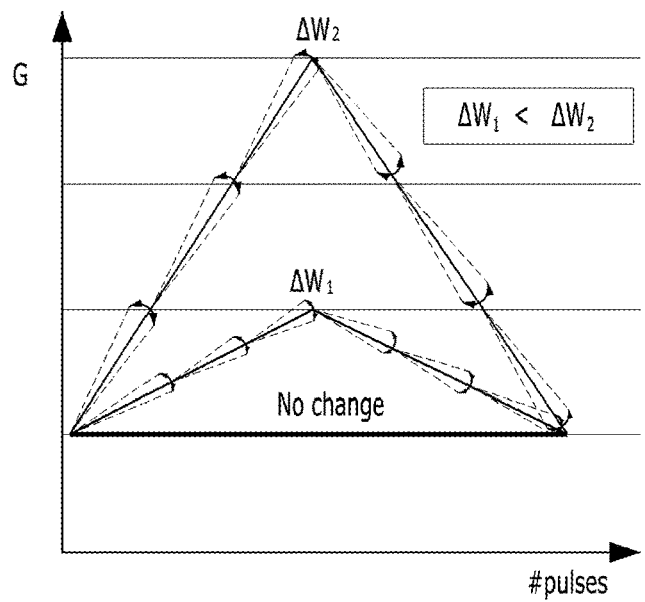
Figure 2C:
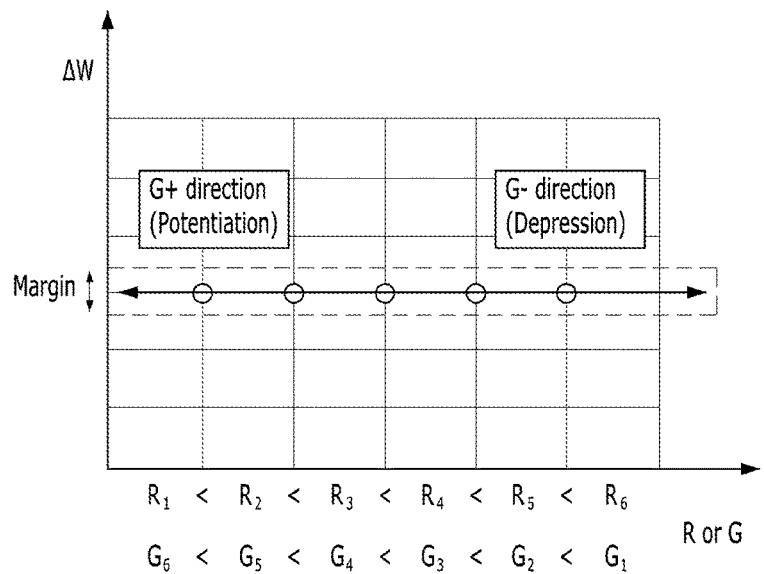
Figure 2D:
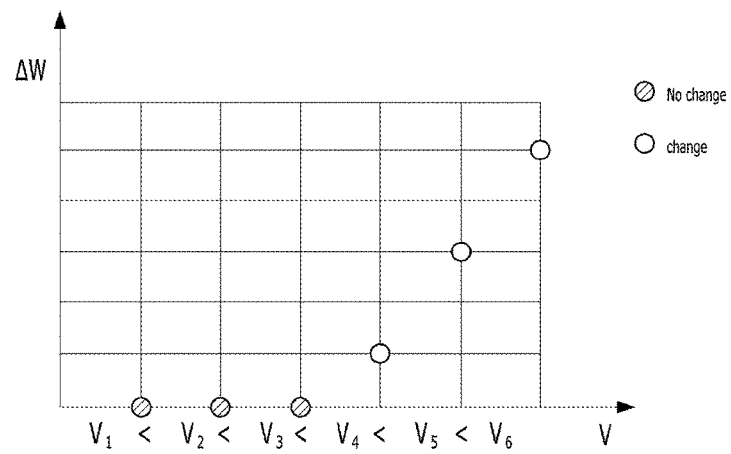

Specifically, FIGS. 2A and 2B illustrate the electrical conductivity (G) of a synapse 30 as a function of the number of electrical pulses that are applied to the synapse 30. FIG. 2C shows a change in weight (W) of the synapse 30 with a change in resistance (R) or electrical conductivity (G) of the synapse 30. FIG. 2D shows the change in weight (W) of the synapse 30 as a function of a voltage (V) that is applied to the synapse 30.

Referring to FIGS. 2A and 2B, if first-polarity voltage pulses (e.g., negative voltage pulses) with a voltage higher than a certain critical value are repeatedly applied to the synapse 30 that is in a low-resistance state, the electrical conductivity (G) of the synapse 30 may gradually increase. A direction in which the electrical conductivity (G) of the synapse 30 increases may be referred to as a G+ direction or a potentiation direction.

If second-polarity voltage pulses (e.g., positive voltage pulses) with a voltage equal to or higher than the reset voltage are applied to the synapse 30, the reset operation can be performed so that the resistance state of the synapse 30 changes to a high-resistance state.

If the second-polarity voltage pulses are repeatedly applied to the synapse 30 that is in the high-resistance state, the electrical conductivity (G) of the synapse 30 may gradually decrease. A direction in which the electrical conductivity (G) of the synapse 30 decreases may be referred to as a G− direction or a depression direction.

If first-polarity voltage pulses with a voltage equal to or higher than the set voltage are applied again to the synapse 30, the set operation may be performed so that the resistance state of the synapse 30 changes again to the low-resistance state.

Herein, it is preferable that, if the size and width of pluses are constant, the electrical conductivity (G) of the synapse 30 in the potentiation operation and the depression operation be substantially symmetric while a rate of change in the electrical conductivity (G) is substantially constant. In other words, it is preferable that the electrical conductivity (G) of the synapse 30 in the potentiation operation and the depression operation have linearity and symmetry, thereby preventing an abrupt change in the resistance of the synapse 30 in the set operation and the reset operation.

The linearity and symmetry of the electrical conductivity (G) of the synapse 30 in the potentiation operation and the depression operation can be required in both the case in which a rate of change in the weight (W) of the synapse 30 is small (see $\Delta W_1$ in FIG. 2B) and the case in which the rate of change in the weight (W) of the synapse 30 is great (see $\Delta W_2$ in FIG. 2B). However, if the size or width of pulses is not sufficiently large, the electrical conductivity (G) of the synapse 30 may not change regardless of the number of the pulses.

Referring to FIG. 2C, it is preferable that the rate of change in the weight (W) of the synapse 30 be substantially constant regardless of a current state of the synapse 30, that is, the current resistance (R) or current electrical conductivity (G) of the synapse 30.

Referring to FIG. 2D, at a voltage equal to or lower than a certain critical value, for example, $V_3$, the weight (W) and/or electrical conductivity (G) of the synapse 30 does not change. Namely, the rate of change in the weight (W) of the synapse 30 is 0. On the other hand, at a voltage higher than the certain critical value, for example, $V_4$, the rate of change in the weight (W) of the synapse 30 increases. Herein, the rate of change in the weight (W) of the synapse 30 may increase substantially in proportion to the magnitude of the voltage.

In summary, it is preferable that the electrical conductivity (G) of the synapse 30 of the neuromorphic device increase or decrease substantially in proportion to the number of electrical pulses regardless of the current state of the synapse 30 and that the electrical conductivity (G) of the synapse 30 in the potentiation operation and the depression operation be substantially symmetric. Herein, it is preferable that the change in the electrical conductivity (G) of the synapse 30 occur only at a voltage higher than the certain critical value. As the characteristics of the synapse 30 are closer to the above-described characteristics, the learning and recognition accuracy of the neuromorphic device can increase, and thus operating characteristics thereof can be improved.

Embodiments of the present disclosure are directed to a synapse capable of satisfying the above-described characteristics to the maximum possible extent. Prior to the description of the embodiments, a synapse of a comparative example will be described.

Figure 3A:
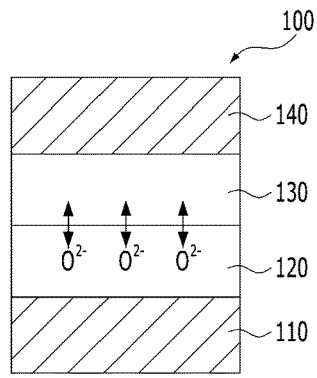
FIG. 3A is a cross-sectional view illustrating a synapse of a comparative example.
Figure 3B:
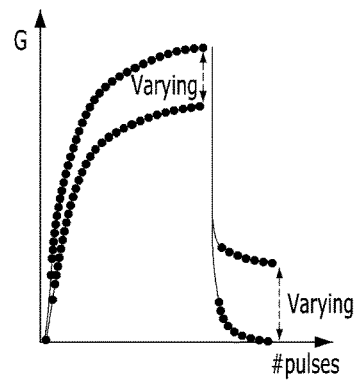
FIGS. 3B and 3C illustrate characteristics of the synapse shown in FIG. 3A.
Figure 3C:
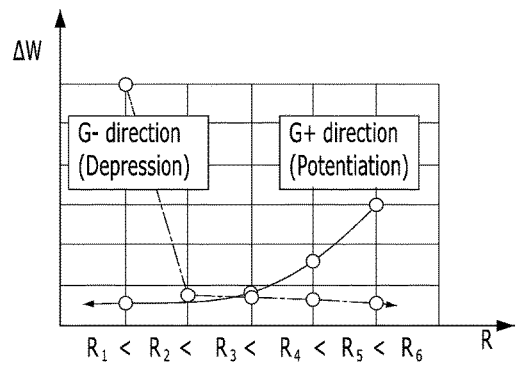

FIG. 3A is a cross-sectional view illustrating a synapse of a comparative example, and FIGS. 3B and 3C illustrate characteristics of the synapse shown in FIG. 3A.

Referring to FIG. 3A, the synapse 100 of the comparative example may include a first electrode 110, a second electrode 140, an oxygen-containing layer 120 disposed between the first electrode 110 and the second electrode 140, and a reactive metal layer 130 interposed between the oxygen-containing layer 120 and the second electrode 140 and capable of reacting with oxygen ions from the oxygen-containing layer 120.

The first and second electrodes 110 and 140 serve as two ends of the synapse 100 to which a voltage or current is to be applied. Each of the first and second electrodes 110 and 140 may be formed of any of various electrically conductive materials such as metals or metal nitrides. The first electrode 110 may be connected to any one of a corresponding row line 12 and a corresponding column line 22 shown in FIG. 1, and the second electrode 140 may be connected to the other one of the corresponding row line 12 and the corresponding column line 22. The synapse 100 can be driven by electrical pulses. At least one of the first and second electrodes 110 and 140 may be omitted, and in this case, the row line 12 or the column line 22 that is supposed to be coupled to the omitted one can function as an electrode instead of the omitted one.

The oxygen-containing layer 120 is a layer containing oxygen ions, and may include any of various metal oxides including e.g., a transition metal oxide containing Ti, Ni, Al, Nb, Hf or V, and a perovskite-based metal oxide such as PCMO or LCMO.

The reactive metal layer 130 is a layer capable of reacting with oxygen ions to form a dielectric oxide, and may include a metal such as Al, Ti, Ta or Mo, or a nitride of the metal.

In an initial stage, the synapse 100 may be in a relatively low resistance state. Thus, to perform an operation of a neuromorphic device, an initialization operation for changing the low-resistance state of the synapse 100 to a high-resistance state may be required.

If voltage pulses with a certain polarity are applied through the first and second electrodes 110 and 140 to the synapse 100 that is in the low-resistance state, the oxygen ions in the oxygen-containing layer 120 may move toward the reactive metal layer 130 and then react with a metal included in the reactive metal layer 130, thereby forming a dielectric oxide layer at an interface between the oxygen-containing layer 120 and the reactive metal layer 130. As a result, the resistance state of the synapse 100 can be changed to the high-resistance state. As the number of voltage pulses applied to the synapse 100 increases, a thickness of the dielectric oxide layer may be increased, and thus the electrical conductivity of the synapse 100 may progressively decrease.

On the contrary, if voltage pulses with a polarity opposite to the certain polarity are applied to the synapse 100 that is in the high-resistance state, the oxygen ions in the oxygen-containing layer 120 may move in a direction opposite to the reactive metal layer 130, and thus the thickness of the formed dielectric oxide layer may be decreased. As a result, the resistance state of the synapse 100 may be changed to the low-resistance state. As the number of voltage pulses applied to the synapse 100 increases, the thickness of the dielectric oxide layer may be decreased, and thus the electrical conductivity of the synapse 100 may progressively increase.

As described above, as the thickness of the dielectric oxide layer is progressively increased or decreased by voltage pulses applied to the synapse 100, the resistance state of the synapse 100 switches between the high-resistance state and the low-resistance state. Thus, the synapse 100 may have an analog behavior, such that the electrical conductivity of the synapse 100 in each of the high-resistance state and the low-resistance state progressively changes. However, this does not satisfy the characteristics described above with reference to FIGS. 2A to 2D. The characteristics of the synapse 100 will be described in detail with reference to FIGS. 3B and 3C.

Referring to FIG. 3B, if first-polarity voltage pulses are applied to the synapse 100 that is in the low-resistance state, the electrical conductivity (G) of the synapse 100 progressively increases as the number of the voltage pulses increases. However, a rate of change in the electrical conductivity (G) is very high in an initial stage of a set operation and gradually decreases with the passage of time. Thus, there is a problem in that the linearity of the synapse 100 may not be satisfied.

In addition, if second-polarity voltage pulses with a voltage equal to or higher than a reset voltage are applied to the synapse 100 that is in the low-resistance state, a reset operation may be performed such that the resistance state of the synapse 100 changes to the high-resistance state. With an increase in the number of voltage pulses applied to the synapse 100 in the high-resistance state, the electrical conductivity (G) of the synapse 100 may progressively decrease. However, an abrupt decrease in the electrical conductivity (G) can occur in the reset operation. In addition, the rate of change in the electrical conductivity (G) is very high in an initial stage of the reset operation and gradually decreases with the passage of time. Thus, there is a problem in that the linearity and symmetry of the synapse 100 may not be satisfied.

Referring to FIG. 3C, a rate of change in weight (W) of the synapse 100 is not constant. If the current resistance (R) of the synapse 100 in the G+ direction is relatively high (e.g., $R_5$ or $R_6$), the rate of change in the weight (W) of the synapse 100 may increase. In other words, in the initial stage of the set operation with relatively high resistance (R), the rate of change in the electrical conductivity (G) of the synapse 100 may be high. On the contrary, if the current resistance (R) of the synapse 100 in the G− direction is relatively low (e.g., $R_1$), the rate of change in the weight (W) of the synapse 100 may increase. In other words, in the initial stage of the reset operation with relatively low resistance (R), the rate of change in the electrical conductivity (G) of the synapse 100 may be high. Accordingly, the linearity of the synapse 100 may not be satisfied.

Additionally, in the initial stages of the set and reset operations, the rate of change in the weight (W) in the G− direction is higher than the rate of change in the weight (W) in the G+ direction. This indicates that the symmetry of the synapse 100 is not satisfied.

The reasons why the above-described problems arise are that the rate of change in the resistance (R) of the synapse 100 in the initial stages is high and that the speed of the reset operation in which the dielectric oxide layer is formed is much higher than the speed of the set operation in which the dielectric oxide layer disappears.

The embodiments of the present disclosure are directed to a synapse capable of overcoming the problems of the comparative example.

Figure 4:
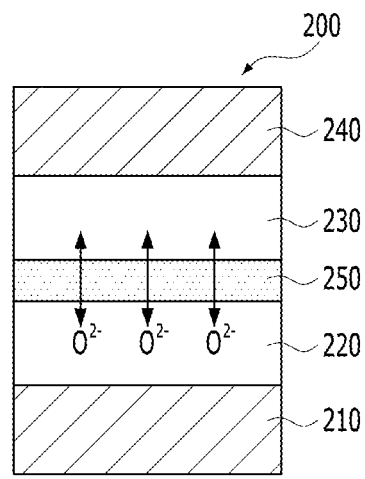
FIG. 4 is a cross-sectional view illustrating a synapse according an embodiment.

FIG. 4 is a cross-sectional view illustrating a synapse 200 according an embodiment. For the simplicity of explanation, detailed description for parts substantially identical to those of the comparative example shown in FIG. 3A will be omitted.

Referring to FIG. 4, the synapse 200 may include a first electrode 210, a second electrode 240, an oxygen-containing layer 220 disposed between the first electrode 210 and the second electrode 240, a reactive metal layer 230 disposed between the oxygen-containing layer 220 and the second electrode 240 and capable of reacting with oxygen ions from the oxygen-containing layer 220, and an oxygen diffusion-retarding layer 250 sandwiched between the oxygen-containing layer 220 and the reactive metal layer 230.

Herein, the first electrode 210, the oxygen-containing layer 220, the reactive metal layer 230, and the second electrode 240 may be substantially the same as the first electrode 110, the oxygen-containing layer 120, the reactive metal layer 130, and the second electrode 140 of the comparative example shown in FIG. 3A, respectively.

The oxygen diffusion-retarding layer 250 is a layer sandwiched between the oxygen-containing layer 220 and the reactive metal layer 230, and can perform a function of retarding the movement of oxygen ions from the oxygen-containing layer 220 to the reactive metal layer 230. The oxygen diffusion-retarding layer 250 may be formed of any of dielectric materials, such as oxides, nitrides, or combinations thereof, and semiconductor materials. The oxygen diffusion-retarding layer 250 may hinder the movement of oxygen ions without completely blocking the movement of oxygen ions, thereby reducing a speed of forming a dielectric oxide layer at an interface between the oxygen-containing layer 220 and the reactive metal layer 230. The oxygen diffusion-retarding layer 250 may have a thickness that does not completely block the movement of oxygen ions. In an embodiment, the thickness may be less than 10 nm.

As described above, the speed of forming the dielectric oxide layer may be reduced by the oxygen diffusion-retarding layer 250, and thus an operational speed of a reset operation may be reduced. As a result, an abrupt change in the electrical conductivity of the synapse 200 in the reset operation may be prevented, and thus the symmetry of the synapse 100 may be improved.

In addition, when the oxygen diffusion-retarding layer 250 is formed of a semiconductor material or a dielectric material, resistance values of the synapse 200 in a high-resistance state and a low-resistance state may increase. Particularly, the resistance value in the low-resistance state significantly increases. Accordingly, a rate of change in the resistance of the synapse 200 may be decreased, and thus an abrupt increase or decrease in the resistance of the synapse 200 in an initial stage of the set operation or the reset operation may be prevented. As a result, the linearity of a synapse may be enhanced.

Figure 5:
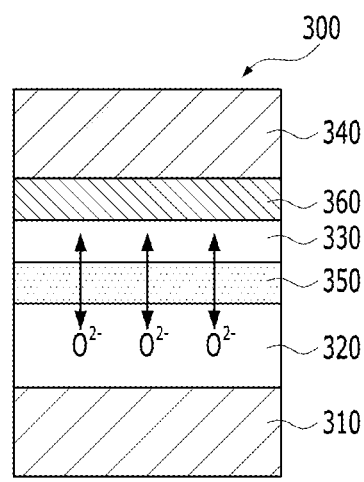
FIG. 5 is a cross-sectional view illustrating a synapse according another embodiment.

FIG. 5 is a cross-sectional view illustrating a synapse 300 according to another embodiment. For the simplicity of explanation, detailed description for parts substantially identical to those of the embodiment shown in FIG. 4 will be omitted.

Referring to FIG. 5, the synapse 300 may include a first electrode 310, a second electrode 340, an oxygen-containing layer 320 disposed between the first electrode 310 and the second electrode 340, a reactive metal layer 330 disposed between the oxygen-containing layer 320 and the second electrode 340 and capable of reacting with oxygen ions from the oxygen-containing layer 320, an oxygen diffusion-retarding layer 350 sandwiched between the oxygen-containing layer 320 and the reactive metal layer 330, and a resistance layer 360 sandwiched between the reactive metal layer 330 and the second electrode 340.

Herein, the first electrode 310, the oxygen-containing layer 320, the reactive metal layer 330, the second electrode 340, and the oxygen diffusion-retarding layer 350 may be substantially the same as the first electrode 210, the oxygen-containing layer 220, the reactive metal layer 230, the second electrode 240, and the oxygen diffusion-retarding layer 250 of the embodiment shown in FIG. 4, respectively.

The resistance layer 360 may include a semiconductor material or a dielectric material, and serve to increase resistance values of the synapse 300 in a low-resistance state and a high-resistance state. Particularly, the resistance value in the low-resistance state can significantly increase. Therefore, in comparison with the embodiment of FIG. 4, a rate of change in the resistance of the synapse 300 may further decrease, and thus an abrupt increase or decrease in the resistance of the synapse 300 in a set operation and a reset operation may further be prevented compared to the synapse 200. As a result, the linearity of a synapse may further be enhanced.

In this embodiment, the resistance layer 360 is sandwiched between the second electrode 340 and the reactive metal layer 330, but the position of the resistance layer 350 may be changed in various ways. In another embodiment, the resistance layer 360 may be sandwiched between the first electrode 310 and the oxygen-containing layer 320 instead of between the second electrode 340 and the reactive metal layer 330. In still another embodiment, the resistance layer 360 may be sandwiched between the second electrode 340 and the reactive metal layer 330 and between the first electrode 310 and the oxygen-containing layer 320.

The neuromorphic device according to the above-described embodiments may be used in various devices or systems. This will be described by way of example with reference to FIG. 6.

Figure 6:
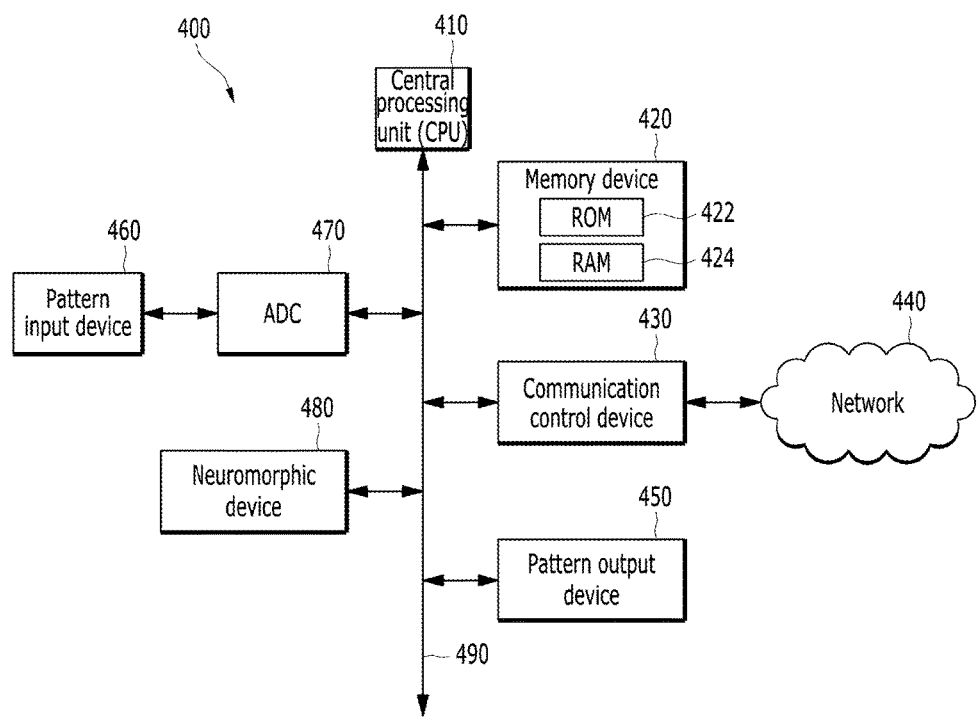
FIG. 6 shows a pattern recognition system according to an embodiment.

FIG. 6 shows a pattern recognition system 400 according to an embodiment.

The pattern recognition system 400 may be a system for recognizing various patterns, such as a speech recognition system or an image recognition system. The pattern recognition system 400 may be configured with the neuromorphic device of the above-described embodiments.

Referring to FIG. 6, the pattern recognition system 400 may include a central processing unit (CPU) 410, a memory device 420, a communication control device 430, a pattern output device 450, a pattern input device 460, an analog-digital converter (ADC) 470, a neuromorphic device 480, a bus line 490, and the like. The pattern recognition system 400 is connected to a network 440 through the communication control device 430.

The central processing unit 410 may generate and transmit various signals used in a learning operation of the neuromorphic device 480, and may perform various processing operations for recognizing patterns of sound, images or the like based on an output from the neuromorphic device 480. This central processing unit 410 may be connected, via the bus line 490, to the memory device 420, the communication control device 430, the pattern output device 450, the analog-digital converter 470, and the neuromorphic device 480.

The memory device 420 may store various information required for the pattern recognition system 400. For this, the memory device 420 may include different memory devices. For example, the memory device 420 may include a ROM device 422, a RAM device 424, and the like. The ROM device 422 may store various programs or data which are used in the central processing unit 410 in order to perform the learning operation of the neuromorphic device 480, pattern recognition, etc. The RAM device 424 may store the program or data downloaded from the ROM device 422, or store data, such as sound or images, which were converted or analyzed by the analog-digital converter 470.

The communication control device 430 may exchange recognized data (e.g., sound or images) with other communication control devices through the network 440.

The pattern output device 450 may output the recognized data (e.g., sound or images) in various manners. For example, the pattern output device 450 may include one or more of a printer, a display unit, and the like, and may output sound waveforms or display images.

The pattern input device 460 may receive analog-type sound, images, etc., and may include one or more of a microphone, a camera, etc.

The analog-digital converter 470 may convert analog data, provided by the pattern input device 460, to digital data, and may also analyze the digital data.

The neuromorphic device 480 may perform learning, recognition, and the like using data provided by the analog-digital converter 470, and may output data corresponding to recognized patterns. The neuromorphic device 480 may include one or more neuromorphic devices that include synapses of the embodiments described above. For example, the neuromorphic device 480 may include a plurality of synapses, and each of the plurality of synapses may include a first electrode, a second electrode spaced apart from the first electrode, an oxygen-containing layer disposed between the first electrode and the second electrode, a reactive metal layer disposed between the oxygen-containing layer and the second electrode and capable of reacting with oxygen ions from the oxygen-containing layer; and an oxygen diffusion-retarding layer provided between the oxygen-containing layer and the reactive metal layer, the oxygen diffusion-retarding layer hindering movement of oxygen ions from the oxygen-containing layer to the reactive metal layer. By using this configuration, the symmetry and linearity of synapses can be ensured. Accordingly, operating characteristics of the neuromorphic device 480 can be improved, and thus operating characteristics of the pattern recognition system 400 may also be improved.

In addition, the pattern recognition system 400 may further include other components required for properly performing its function(s). For example, it may further include one or more input devices such as a keyboard, a mouse and the like so as to receive various parameters and/or setting conditions for operations of the pattern recognition system 400.

According to the embodiments described above, the symmetry and linearity of a synapse can be enhanced, and thus operating characteristics of a neuromorphic device can be improved.

While the present invention has been described with respect to the specific embodiments, it will be apparent to those skilled in the art that various changes and modifications may be made without departing from the spirit and scope of the invention as defined in the following claims.

What is claimed is:

1. A synapse comprising:
a first electrode;
a second electrode spaced apart from the first electrode;
an oxygen-containing layer disposed between the first electrode and the second electrode;
a reactive metal layer disposed between the oxygen-containing layer and the second electrode and capable of reacting with oxygen ions from the oxygen-containing layer; and
an oxygen diffusion-retarding layer provided between the oxygen-containing layer and the reactive metal layer, the oxygen diffusion-retarding layer hindering movement of oxygen ions from the oxygen-containing layer to the reactive metal layer, and
wherein electrical conductivity of the synapse changes depending on a thickness of a dielectric layer generated in the reactive metal layer along an interface between the oxygen diffusion-retarding layer and the reactive metal layer by a reaction between oxygen of the oxygen-containing layer and a metal of the reactive metal layer.

2. The synapse of claim 1, wherein
the thickness of the dielectric layer increases with an increase in a number of electrical pulses having a first polarity, which are applied through the first and second electrodes, and the thickness of the dielectric layer decreases with an increase in a number of electrical pulses having a second polarity opposite to the first polarity, which are applied through the first and second electrodes.

3. The synapse of claim 2, wherein the electrical pulses having the first polarity and the electrical pulses having the second polarity have a constant width or constant magnitude, or both.

4. The synapse of claim 1, wherein the oxygen diffusion-retarding layer has a thickness that does not completely block the movement of the oxygen ions.

5. The synapse of claim 1, wherein the oxygen diffusion-retarding layer comprises a dielectric material or a semiconductor material.

6. The synapse of claim 1, further comprising a resistance layer located between the first electrode and the oxygen-containing layer and/or between the second electrode and the reactive metal layer, the resistance layer increasing a resistance value of the synapse.

7. The synapse of claim 1, wherein a potentiation operation is performed so that electrical conductivity of the synapse progressively increases with an increase in a number of electrical pulses having a second polarity, which are applied through the first and second electrodes, and a depression operation is performed so that the electrical conductivity of the synapse progressively decreases with an increase in a number of electrical pulses having a first polarity opposite to the second polarity, which are applied through the first and second electrodes.

8. The synapse of claim 7, wherein the electrical pulses having the first polarity and the electrical pulses having the second polarity have a constant width or a constant magnitude, or both.

9. The synapse of claim 7, wherein the electrical conductivity of the synapse does not change if at least one of width and magnitude of each of the electrical pulses having the first polarity and the electrical pulses having the second polarity is less than a certain critical value.

10. A neuromorphic device comprising:
a first neuron;
a second neuron;
a first line connected to the first neuron and extending in a first direction;
a second line connected to the second neuron and extending in a second direction intersecting with the first line; and
a synapse disposed between the first line and the second line and located at an intersection between the first line and the second line,
wherein the synapse comprises:
an oxygen-containing layer;
a reactive metal layer disposed between the oxygen-containing layer and the second line and capable of reacting with oxygen ions from the oxygen-containing layer; and
an oxygen diffusion-retarding layer provided between the oxygen-containing layer and the reactive metal layer, the oxygen diffusion-retarding layer hindering movement of oxygen ions from the oxygen-containing layer to the reactive metal layer, and
wherein electrical conductivity of the synapse changes depending on a thickness of a dielectric layer generated in the reactive metal layer along an interface between the oxygen diffusion-retarding layer and the reactive metal layer by a reaction between oxygen of the oxygen-containing layer and a metal of the reactive metal layer.

11. The neuromorphic device of claim 10, wherein
the first neuron is configured to derive the first line by selectively providing electrical pulses having a first polarity and electrical pulses having a second polarity opposite to the first polarity;
the thickness of the dielectric layer increases with an increase in the number of the electrical pulses having the first polarity, the electrical conductivity of the synapse decreasing as the thickness of the dielectric layer increases; and the thickness of the dielectric layer decreases with an increase in the number of the electrical pulses having the second polarity, the electrical conductivity of the synapse increasing as the thickness of the dielectric layer decreases.

12. The neuromorphic device of claim 10, wherein the synapse further comprises a resistance layer located between the first line and the oxygen-containing layer and/or between the second line and the reactive metal layer, the resistance layer increasing a resistance value of the synapse.

* * * * *